(12) United States Patent
Schmid et al.

(10) Patent No.: US 9,680,411 B2
(45) Date of Patent: Jun. 13, 2017

(54) METHOD AND DEVICE FOR THE INDUSTRIAL WIRING AND FINAL TESTING OF PHOTOVOLTAIC CONCENTRATOR MODULES

(71) Applicant: Grenzebach Maschinenbau GmbH, Asbach-Baeumenheim (DE)

(72) Inventors: Markus Schmid, Burgheim (DE); Alexander Feineis, Donauwoerth (DE)

(73) Assignee: GRENZEBACH MASCHINENBAU GMBH, Asbach-Baeumenheim (DE)

(*) Notice: Subject to any disclaimer, the term of this patent is extended or adjusted under 35 U.S.C. 154(b) by 95 days.

(21) Appl. No.: 14/353,733

(22) PCT Filed: Dec. 6, 2012

(86) PCT No.: PCT/DE2012/001159
§ 371 (c)(1),
(2) Date: Apr. 23, 2014

(87) PCT Pub. No.: WO2013/091599
PCT Pub. Date: Jun. 27, 2013

(65) Prior Publication Data
US 2015/0236641 A1    Aug. 20, 2015

(30) Foreign Application Priority Data

Dec. 23, 2011   (DE) .................... 20 2011 109 424 U

(51) Int. Cl.
*H02S 50/10*    (2014.01)
*G01R 31/26*    (2014.01)
(Continued)

(52) U.S. Cl.
CPC .............. *H02S 50/10* (2014.12); *F21S 8/006* (2013.01); *G01R 31/26* (2013.01); *H02S 50/00* (2013.01)

(58) Field of Classification Search
CPC ..... H02S 50/00; H02S 50/10; G01R 31/2605; G01R 31/26; F21S 8/006; Y02E 10/50
(Continued)

(56) References Cited

U.S. PATENT DOCUMENTS 4,149,665 A * 4/1979 Frosch ................ H01L 31/1876
                                                    136/244
4,834,805 A    5/1989 Erbert
(Continued)

FOREIGN PATENT DOCUMENTS

JP    H08336893    12/1996
JP    2001071171    3/2001
(Continued)

*Primary Examiner* — Jermele M Hollington
*Assistant Examiner* — Christopher McAndrew
(74) *Attorney, Agent, or Firm* — Duane Morris LLP; J. Rodman Steele, Jr.; Gregory M. Lefkowitz

(57) ABSTRACT

The invention relates to a method and to a device for the industrial wiring and final testing of photovoltaic concentrator modules, comprising a module frame, a lens disc, a sensor carrier disc, and electrical cable routing, having the following features: a) a laser contacting device for contactless connection of connecting lines between the individual sensor (11) and of connection elements (17) and of collector contact plates (19), wherein the cable routing on the sensor carrier disc (13) has in each case 5 CPV sensors connected in parallel as the basic structure, and said parallel circuits are connected in series, b) a device for testing electrical properties, wherein the CPV sensors (11) per se have a specific voltage applied thereto, and the light emitted therefrom via the lenses (15) is detected and evaluated, and c) a device for testing the tightness (5) of finished concentrator modules, wherein compressed air is applied to the interior of said modules and testing for the emission of compressed air is carried out.

4 Claims, 6 Drawing Sheets

Figure 1:
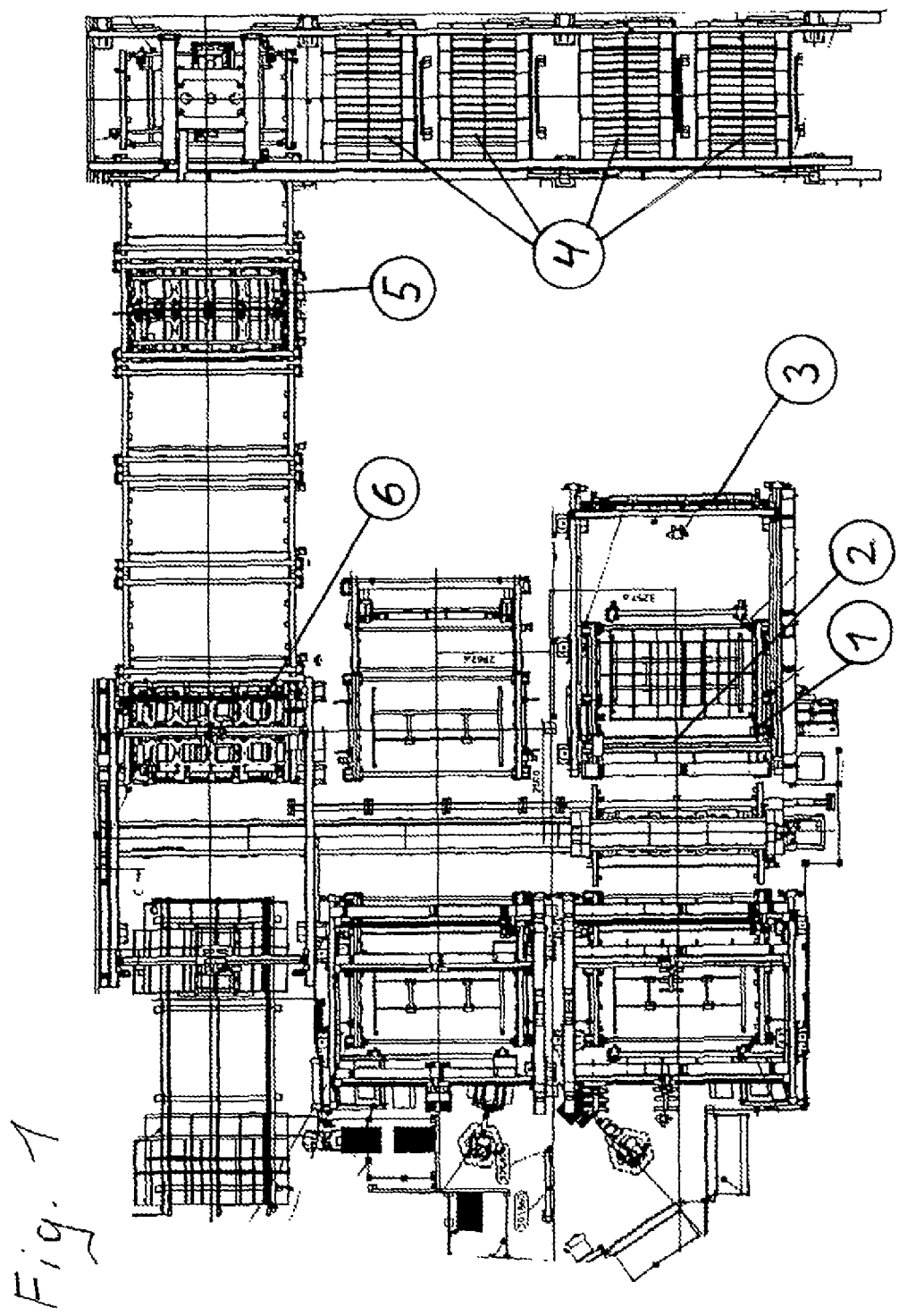

(51) Int. Cl.
*H02S 50/00* (2014.01)
*F21S 8/00* (2006.01)

(58) Field of Classification Search
USPC .................................................. 324/761.017
See application file for complete search history.

(56) References Cited

U.S. PATENT DOCUMENTS

| | | | | |
|---|---|---|---|---|
| 6,515,218 | B1* | 2/2003 | Shimizu | H01L 31/0512 136/244 |
| 6,545,211 | B1* | 4/2003 | Mimura | H01L 31/02021 136/244 |
| 6,984,804 | B2* | 1/2006 | Takeyama | H01L 31/0512 219/121.64 |
| 7,910,035 | B2* | 3/2011 | Gibson | B29C 45/14778 136/246 |
| 8,004,270 | B2 | 8/2011 | Kasahara et al. | |
| 8,080,729 | B2* | 12/2011 | Fork | H01L 31/022425 136/252 |
| 8,153,886 | B1* | 4/2012 | Garboushian | H01L 31/0504 136/244 |
| 8,847,614 | B2* | 9/2014 | DeBone | G01R 21/06 324/600 |
| 9,054,632 | B2* | 6/2015 | Hinkle | G01R 1/07342 |
| 9,057,752 | B2* | 6/2015 | Luebke | H02S 50/10 |
| 9,103,871 | B2* | 8/2015 | Wang | G01R 31/2605 |
| 9,116,202 | B2* | 8/2015 | Capulong | H01L 21/67103 |
| 2001/0029976 | A1* | 10/2001 | Takeyama | H01L 31/0512 136/244 |
| 2005/0217718 | A1 | 10/2005 | Dings et al. | |
| 2008/0142076 | A1 | 6/2008 | Horne et al. | |
| 2009/0014056 | A1* | 1/2009 | Hockaday | H01L 31/035281 136/247 |
| 2009/0126778 | A1* | 5/2009 | Brounne | H01L 31/0547 136/247 |
| 2009/0126794 | A1 | 5/2009 | Dimroth et al. | |
| 2009/0308426 | A1* | 12/2009 | Kernahan | H01L 31/02021 136/244 |
| 2010/0011565 | A1* | 1/2010 | Zawadzki | B23K 26/0876 29/592.1 |
| 2010/0012187 | A1* | 1/2010 | Paull | H01L 31/0232 136/259 |
| 2010/0034455 | A1 | 2/2010 | Harada et al. | |
| 2010/0318297 | A1* | 12/2010 | Herzig | H02J 13/0062 702/3 |
| 2011/0041890 | A1* | 2/2011 | Sheats | H01L 31/022433 136/244 |
| 2011/0107887 | A1 | 5/2011 | Strass | |
| 2011/0193561 | A1* | 8/2011 | Capulong | H01L 21/67103 324/501 |
| 2011/0265844 | A1 | 11/2011 | Storbeck et al. | |
| 2011/0273163 | A1* | 11/2011 | Jungerman | H02S 50/10 324/126 |
| 2011/0279141 | A1* | 11/2011 | Wang | G01R 31/2605 324/761.01 |
| 2011/0279810 | A1* | 11/2011 | Wang | G01R 31/2605 356/72 |
| 2011/0320145 | A1* | 12/2011 | Horng | G01R 31/2605 702/65 |
| 2012/0028381 | A1* | 2/2012 | Tachibana | G01R 31/2605 438/17 |
| 2012/0126120 | A1* | 5/2012 | Fuyuki | G01R 31/2605 250/330 |
| 2012/0133372 | A1* | 5/2012 | Tsai | H02S 50/10 324/501 |
| 2012/0152309 | A1* | 6/2012 | Miller | F24J 2/5424 136/246 |
| 2012/0217973 | A1* | 8/2012 | Avrutsky | G01R 31/2605 324/501 |
| 2012/0223734 | A1* | 9/2012 | Takada | H02S 50/10 324/761.01 |
| 2012/0279551 | A1* | 11/2012 | Garboushian | H01L 31/0504 136/246 |
| 2013/0014808 | A1* | 1/2013 | Brounne | H01L 31/048 136/251 |
| 2013/0076382 | A1* | 3/2013 | Park | G01R 31/2605 324/750.03 |
| 2013/0120017 | A1* | 5/2013 | Hopf | G08B 13/1409 324/761.01 |
| 2013/0141133 | A1* | 6/2013 | Kratochvil | H01L 31/02021 324/761.01 |
| 2013/0147508 | A1* | 6/2013 | Cravey | G01J 1/0411 324/761.01 |
| 2013/0161537 | A1* | 6/2013 | Hatakeyama | H01L 31/206 250/491.1 |
| 2013/0169306 | A1* | 7/2013 | Nishikawa | G01J 1/32 324/761.01 |
| 2013/0176049 | A1* | 7/2013 | Bauer | B64G 1/56 324/761.01 |
| 2013/0181736 | A1* | 7/2013 | Gostein | H02S 50/10 324/761.01 |
| 2013/0200918 | A1* | 8/2013 | Rubin | H02S 50/10 324/761.01 |
| 2013/0214808 | A1* | 8/2013 | Wang | G01R 31/2605 324/750.24 |
| 2013/0222004 | A1* | 8/2013 | Nakanishi | G01R 31/2605 324/754.23 |
| 2013/0226480 | A1* | 8/2013 | Dalibor | G01R 31/2605 702/58 |
| 2013/0249588 | A1* | 9/2013 | Daugy | H02S 50/10 324/757.04 |
| 2013/0265077 | A1* | 10/2013 | Yang | G01R 31/2605 324/761.01 |
| 2013/0278244 | A1* | 10/2013 | Zhang | G01R 31/2605 324/130 |
| 2013/0285670 | A1* | 10/2013 | Yoshidomi | G01R 31/025 324/510 |
| 2013/0300446 | A1* | 11/2013 | Capulong | H01L 21/67103 324/756.01 |
| 2013/0300449 | A1* | 11/2013 | Nakamura | H01L 31/02021 324/761.01 |
| 2013/0314118 | A1* | 11/2013 | Mak | G01R 31/2605 324/761.01 |
| 2013/0321021 | A1* | 12/2013 | Kokkonen | G01R 31/2605 324/761.01 |
| 2013/0328587 | A1* | 12/2013 | Linden | G01R 31/2605 324/761.01 |
| 2013/0342230 | A1* | 12/2013 | Wang | G01R 31/2605 324/750.03 |
| 2016/0064588 | A1* | 3/2016 | Paull | H01L 31/0543 136/259 |

FOREIGN PATENT DOCUMENTS

| | | |
|---|---|---|
| JP | 2002231983 | 8/2002 |
| JP | 2007146201 | 6/2007 |
| JP | 2009105112 | 9/2008 |
| JP | 2008543066 | 11/2008 |
| JP | 2010165995 | 7/2010 |
| WO | 2007/125778 | 8/2007 |

* cited by examiner

METHOD AND DEVICE FOR THE INDUSTRIAL WIRING AND FINAL TESTING OF PHOTOVOLTAIC CONCENTRATOR MODULES

CROSS-REFERENCE TO RELATED APPLICATIONS

This application is a §371 national stage entry of International Application No. PCT/DE2012/001159, filed Dec. 6, 2012, which claims priority to German Application No. 20 2011 109 424.7 filed Dec. 23, 2011.

There have already been approaches for many years in the field of photovoltaics for working with concentrated solar radiation. In this case, the radiation of the sun is concentrated by means of mirrors and/or lenses and is directed onto special concentrator solar cells. Corresponding concentrating photovoltaics (CPV) systems are currently being tested at the Spanish Institute for Concentration Photovoltaic Systems (ISFOC) at Castilla in Puertollano. The sunlight is bundled using lenses or mirrors to four hundred to one thousand times intensity before it hits small solar cells which are much more efficient than conventional silicon solar cells.

Reference is made in this regard to the following prior art from the patent literature.

U.S. Pat. No. 4,834,805 A discloses a photovoltaic power module having the following features.

An arrangement of photovoltaic semiconductor crystal cells, distributed in individual cell locations in a layered substrate, wherein these are enclosed by two electrically conductive layers and are separated by means of an insulating layer. This module further consists of a light-conveying layer formed of lenses, which is arranged at a distance from the layered substrate, wherein incident radiation in the light-conveying layer is focused by means of lenses into the substrate, and wherein the thickness of the lens layer, of the substrate layer and of the space therebetween is approximately 2 inches.

DE 10 2006 007 472 A1 discloses a photovoltaic concentrator module comprising a lens pane and a base pane, on which solar cells are accommodated, and a frame, wherein the frame is arranged peripherally along the edge of the lens pane and the base pane in a manner connecting the lens pane and the base pane.

This known concentrator module is to be improved to the effect that it can be produced cost-effectively, is durable, and allows simple and flexible integration of additional components which cannot be accommodated on the lens pane or the base pane or can only be accommodated thereon with difficulty. In addition, a method is to be developed which enables the production of such concentrator modules.

The problem addressed here is solved in that, on the one hand, at least one first sealing compound and/or adhesive compound is arranged along the frame between the lens pane and the frame and/or the base pane and the frame, and, on the other hand, at least one second sealing compound is arranged peripherally at least over part of the length of the frame, wherein the two sealing and/or adhesive compounds differ in terms of their curing time and/or gas permeability.

A method for producing a photovoltaic concentrator module as claimed in one of the preceding claims is claimed in claim 57 and is characterized by the following features.

Specifically, in that a frame connecting a lens pane and a base pane is arranged along the edge of the lens pane and the base pane, and in that, on the one hand, at least one first sealing compound and/or adhesive compound is arranged between the frame and the lens pane and/or the frame and the base pane, and, on the other hand, at least one second sealing compound is introduced peripherally along the frame over at least part of the length thereof, wherein the two sealing and/or adhesive compounds differ in terms of their curing times and/or gas permeabilities.

The fact that one of the adhesive compounds serves merely to fix a plate during the production process by means of UV light cannot be inferred here.

DE 10 2010 016 675 A1 describes a photovoltaic module, a method for electrically connecting a plurality of photovoltaic cells, and an arrangement for electrically connecting a plurality of photovoltaic cells.

According to claim 11, a method for electrically connecting a plurality of photovoltaic cells is claimed here, wherein the method comprises the following steps:
1) applying a first plurality of contact wires to a front side of a first photovoltaic cell,
2) applying a second plurality of contact wires to a rear side of the first photovoltaic cell,
3) applying the first plurality of contact wires to a rear side of a second photovoltaic cell, and
4) applying the second plurality of contact wires to a front side of the second photovoltaic cell, wherein]
5) the first plurality of contact wires and the second plurality of contact wires are arranged offset in relation to one another.

It can be inferred from this document as a similar addressed problem that an improved photovoltaic module is to be created, that is to say the contact structure of the photovoltaic cell and the number and dimension of the contact bands (contact wires) are to be combined in an optimized manner.

The problem addressed by the device and the corresponding method according to the invention is that of presenting a device and a method with which industrially produced concentrator modules can be industrially wired economically and reliably, such that a high long-term stability of a concentrator module is achieved in practical operation.

This object is achieved by a device as claimed in claim 1:
A device for the industrial wiring and final testing of photovoltaic concentrator modules consisting of a module frame, a lens pane, a sensor carrier pane, and an electric line guide, comprising the following features:
a) a laser contacting arrangement for contactlessly connecting connection lines between the individual sensors (11) and connection elements (17) and collector contact plates (19), wherein the line guide on the sensor carrier pane (13) has in each case 5 CPV sensors connected in parallel as the basic structure, and wherein the electric connection lines, connection elements (17) and collector contact plates (19) to be applied to the sensor carrier pane (13) are removed automatically from a stored supply and are brought into the region of corresponding holding means, and wherein the contact partners, before the connection by means of a laser contacting arrangement, are fixed in their target position by automatically controlled holding means, and wherein the laser contacting arrangement ensures that the two conductors to be connected are not contacted by the connection tool, are heated only for a very short period of time, and therefore practically do not deform, and wherein the positioning of the holding means is oriented in a laser-controlled manner toward markings on the concentrator module,
b) an arrangement for testing electrical properties, wherein a certain voltage is applied to CPV sensors (11) themselves and the light emitted therefrom via the lenses (15) is detected and evaluated, wherein identified manufacturing faults are corrected, c) an arrangement for testing the tightness (5) of finished concentrator modules, wherein compressed air is applied to the interior of these modules and testing for the emission of compressed air is performed and by the method as claimed in claim 2:

A method for the industrial wiring and final testing of photovoltaic concentrator modules consisting of a module frame, a lens pane, a sensor carrier pane, and an electric line guide, comprising the following features:

a) once the sensor carrier pane (13) has been applied, the concentrator module is brought into the manufacturing region of the electric contacting, b) the required connection lines, connection elements (17) and collector contact plates (19) are each removed from a stored supply, positioned by automatically controlled holding means, and electrically conductively connected by means of an automatically controlled laser contacting arrangement, c) the collector contact plates (19) of the contacted sub-circuits are electrically connected and the resultant collector lines (8, 9) are fed to an external connection element, wherein the concentrator module is then provided with a lens pane (16), d) the concentrator module is fed to an arrangement for testing electrical properties, wherein a certain voltage is applied to CPV sensors (11) themselves and the light emitted therefrom via the lenses (15) is detected and evaluated, e) the concentrator module is then fed to an arrangement for testing the tightness (5) of finished concentrator modules, wherein compressed air is applied to the interior of these modules and testing for the emission of compressed air is performed, f) the results of the measurement of the generated luminous flux and of the tightness test are used to assess the quality of the concentrator module in question, and a corresponding classification is performed.

Claim 3:

The method as claimed in claim 2, characterized in that the electric connection lines, connection elements (17) and collector contact plates (19) to be applied to the sensor carrier pane (13) are automatically removed from a stored supply and are brought into the region of corresponding holding means.

Claim 4:

The method as claimed in claims 2 or 3, characterized in that the contact partners, before the connection by means of the laser contacting arrangement, are fixed in their target position by automatically controlled holding means, and wherein the laser contacting arrangement ensures that the two conductors to be connected are not contacted by the connection tool, are heated only for a very short period of time, and therefore practically do not deform.

Claim 5:

The method as claimed in one of claims 2 to 4, characterized in that the positioning of the holding means is oriented in a laser-controlled manner toward markings on the concentrator module.

Figure 2:
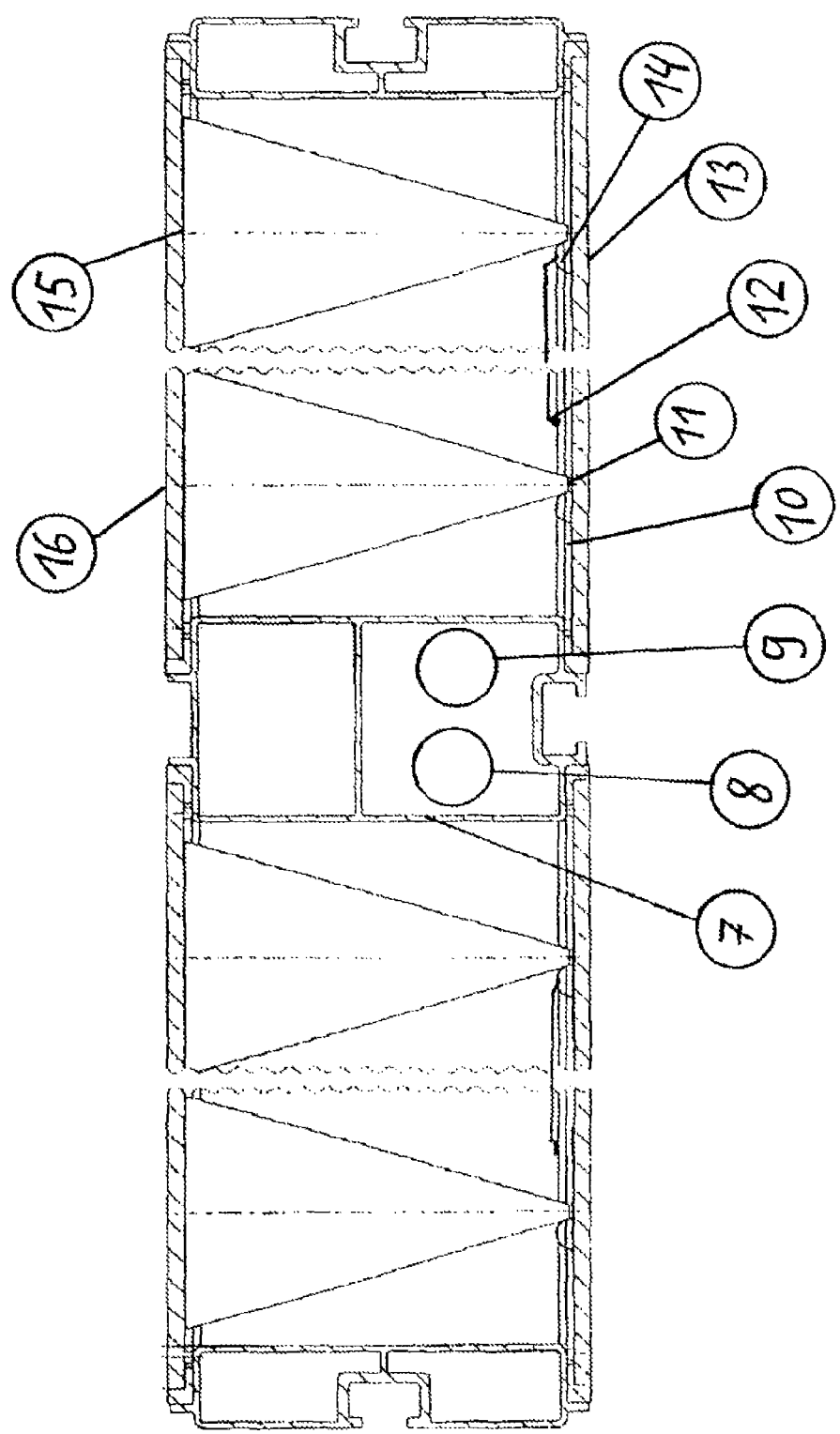
Figure 3:
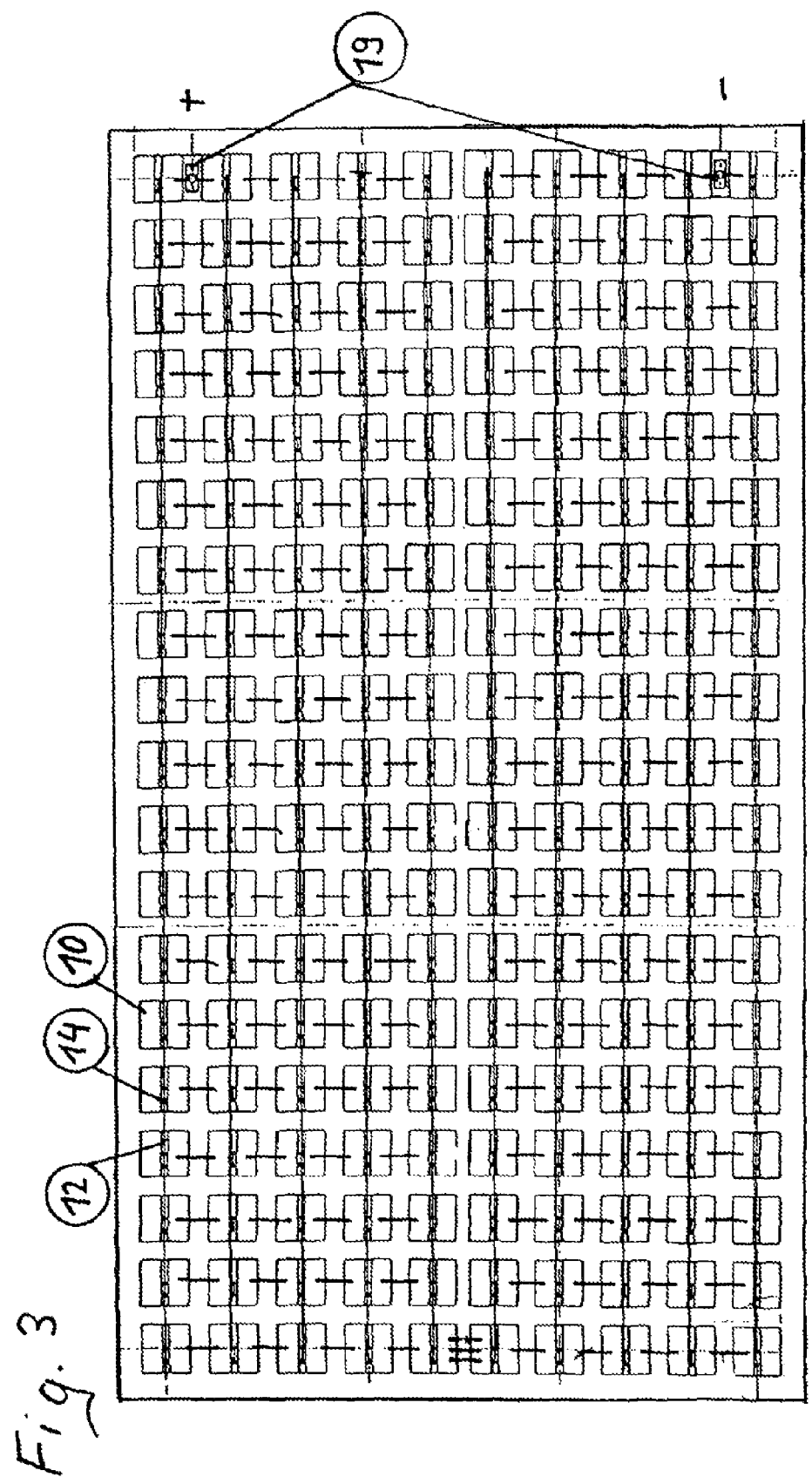
Figure 4:
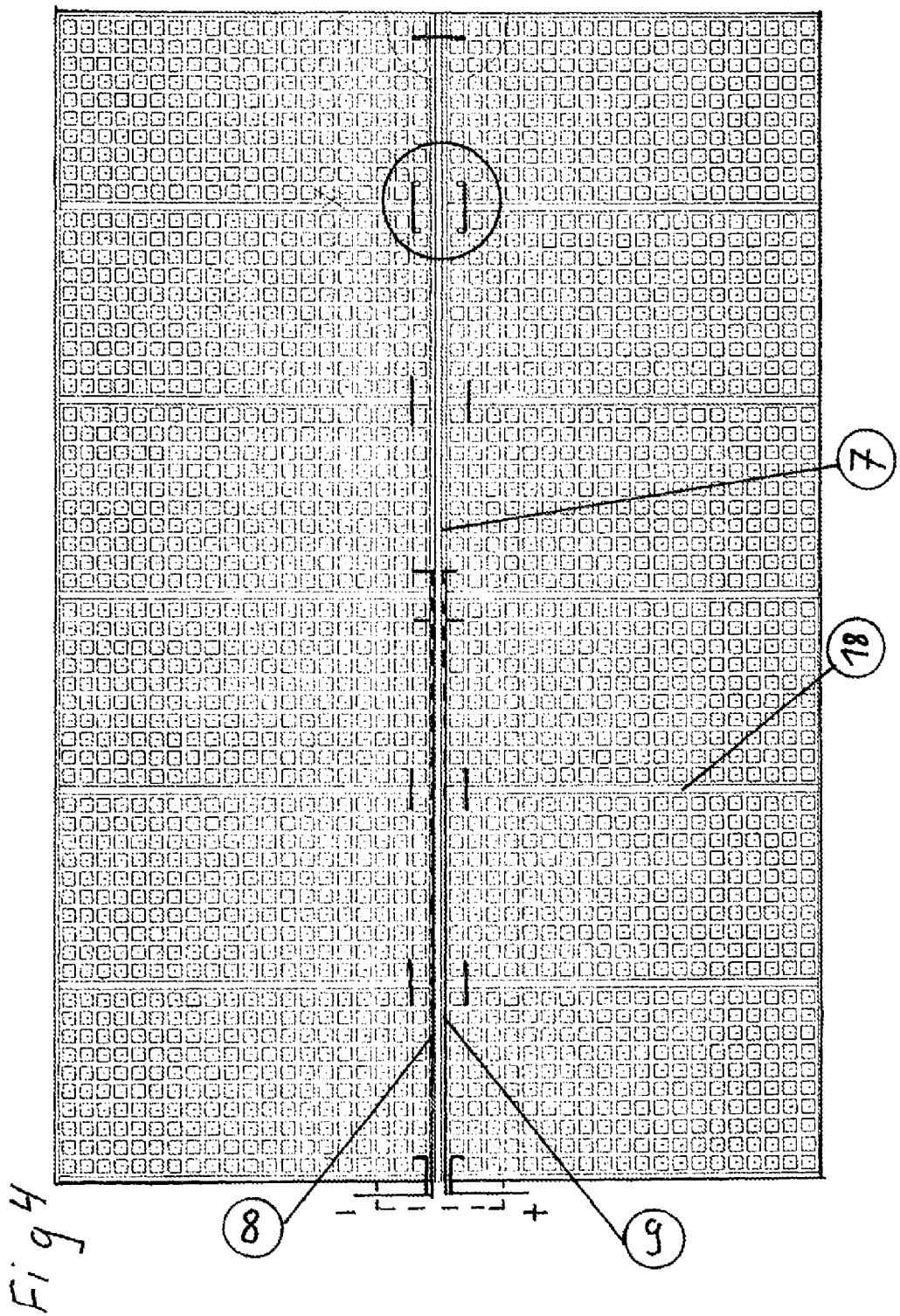
Figure 5:
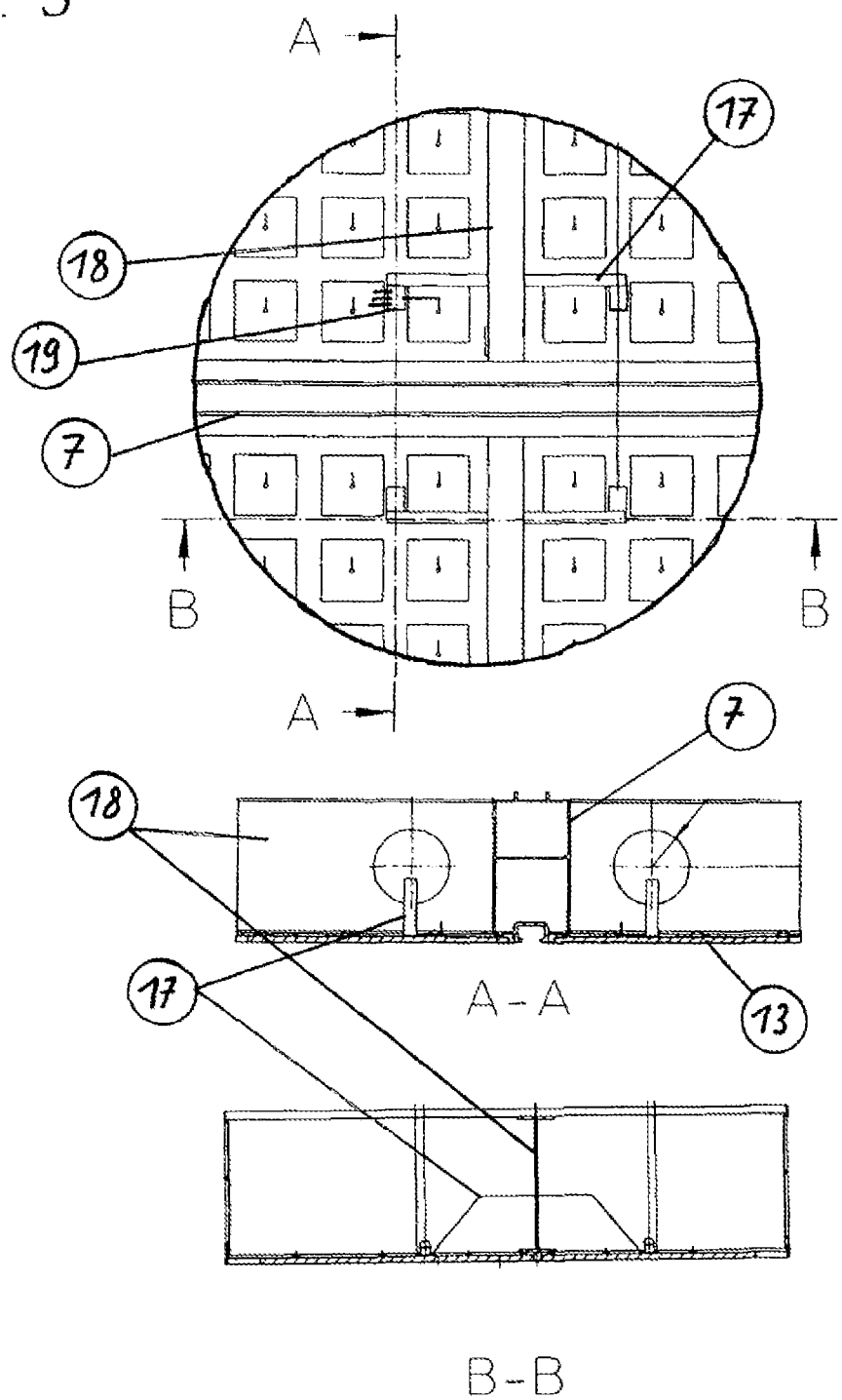
Figure 6:
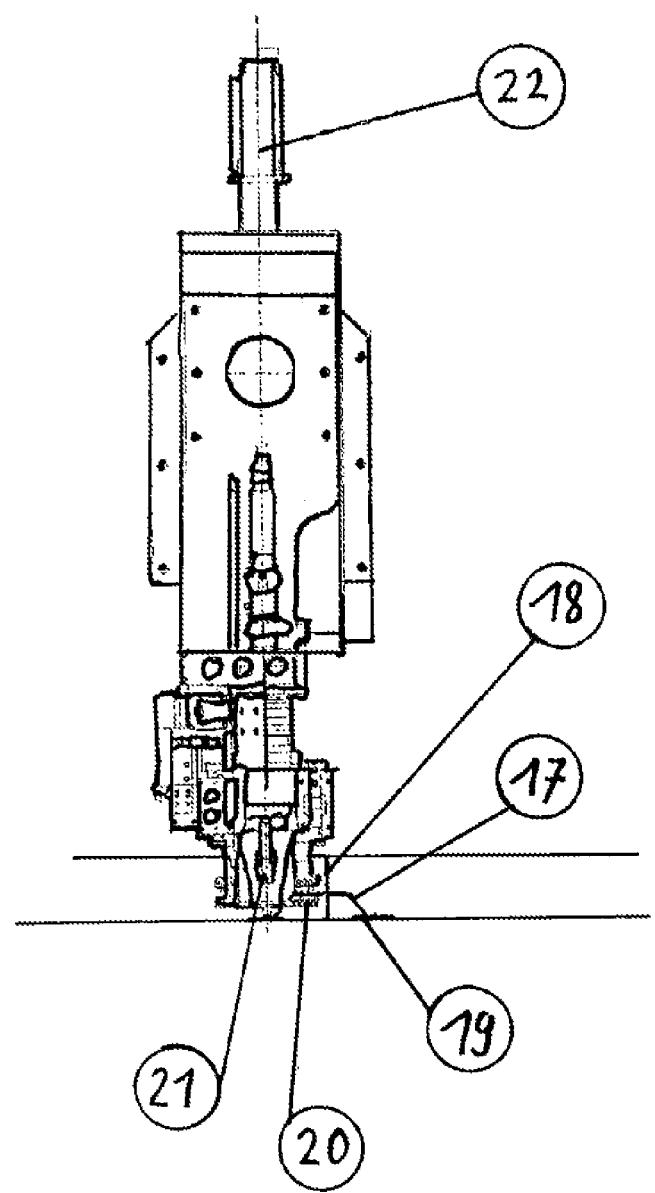

The device according to the invention will be described hereinafter in greater detail. In the drawings more specifically:

FIG. 1: shows a facility for manufacturing concentrator modules in plan view,

FIG. 2: shows a cross section through a concentrator module,

FIG. 3: shows a partial area of a sensor carrier pane,

FIG. 4: shows the entire area of a sensor carrier pane of a concentrator module, FIG. 5: shows a view of a detail of FIG. 4, FIG. 6: shows a cross section through the used laser contacting arrangement.

A facility for manufacturing concentrator modules as are shown in cross section in FIG. 2 is illustrated in plan view in FIG. 1.

Here however, only the part of the overall manufacturing facility provided with reference signs is considered. The manufacturing process is not part of the invention, apart from the moment of the wiring of a concentrator module.

At the moment of wiring of such a module, the sensor carrier pane 13 is already connected to the frame of the module and, in the next processing step after the wiring, experiences the connection to the lens pane 16, which is arranged parallel to and opposite the sensor carrier pane 13. A laser portal 2, which carries a laser head 1, is located at the contacting space 3 indicated in FIG. 1. By means of this portal 2, a module frame can be reached by the laser head 1 at each point to be contacted.

The testing space 5 for the tightness test and the testing space 6 for the subsequent electrical test will be described later.

The stacking spaces 4 enable classification in accordance with quality stages, which are determined substantially by the results at the testing space 5 for the tightness test and at the testing space 6 for the subsequent electrical test.

FIG. 2 shows a cross section through a concentrator module.

This makes it possible to view a concentrator module with its supporting module frame in cross section in an enlarged illustration. A lens pane 16 with a lens 15 can be seen on the upper face, and a sensor carrier pane 13 can be seen on the lower face. The module frame is illustrated here in a manner interrupted on each side in its transverse extent in order to be able to show the shown details true to size. On the right-hand side, references to the used Fresnel lenses 15 can be found in the lens pane 16, and references to the corresponding contact points 14 of the CPV sensors 11 and the associated contact points 12 with the cooling and contact plate 10 can be found in the sensor carrier pane 13. A connection line between a contact point 14 of the CPV sensor illustrated on the right and a contact point 12, separated by the double break line, on the cooling and contact plate 10 of another other CPV sensor 11 to the left of the first CPV sensor can also be seen in this region. Of course, these two CPV sensors are not directly interconnected in practice, since they are separated by the double break line. The collector line 8 with negative polarity and the collector line 9 with positive polarity are illustrated in the region of the central web 7 of the shown concentrator module.

FIG. 3 shows one of the 12 partial areas of a sensor carrier pane 13, as can be seen in its entirety in FIG. 4.

By way of example, a cooling and contact plate 10, a contact point 12 on such a contact plate 10, and a contact point 14 of a CPV sensor on a sensor carrier pane 13 are denoted separately as viewed from above in the uppermost row of the 19 illustrated CPV sensors 11. On the right-hand side of the sensor carrier pane 13, a collector contact plate 19 with positive polarity can be seen above, and a collector contact plate with negative polarity can be seen below. To generate power, 5 CPV sensors are in each case connected in parallel as a basic structure, and these parallel circuits are in turn connected in series, such that the voltages of the parallel circuits are added together. In the illustration shown in FIG. 3, 19 parallel circuits of 5 CPV sensors in each case are connected in series in this way, wherein these CPV sensors extend over the longitudinal side of this partial area. Since a further 5 CPV sensors with the same number of parallel circuits are located on the broad side however on the shown partial area, the voltages thereof are also added together here. The sum voltage of the partial area shown in FIG. 3 is thus given by the sum of 2 times 19 arrangements, connected in parallel in each case, of 5 CPV sensors in each case. Overall voltages of up to 1000 volts can thus be generated by connecting together 2 times 6 partial areas.

FIG. 4 shows a sensor carrier pane 13 of a concentrator module.

The central web 7 of the shown concentrator module, which is illustrated in cross section in FIG. 2, can be seen from above in the middle of the sensor carrier pane 13 over the entire length. The second transverse web is also denoted by 18 to the left of a total of 5 pieces of the concentrator module. The collector line 8 with negative polarity and the corresponding collector line 9 with positive polarity, as can also be inferred from FIG. 2 in cross section, lead the total current supplied by the concentrator module substantially from the geometric center of the sensor carrier pane to the edge in the region of a connection element. This element is not illustrated additionally. A further collector contact plate is denoted by 19 at the right-hand edge of the transverse side of the shown sensor carrier pane 13. The circle surrounding the 4 corner points of the 4 partial areas of the sensor carrier pane 13 arranged to the right is illustrated again in the enlarged view of FIG. 5.

FIG. 5 shows the identifying circle known from figure as a view of a partial detail of FIG. 4. This identifying circle can be seen in the center of the transverse central web 7 of the concentrator module from FIG. 4. A crossmember 18, likewise visible from above, runs perpendicular to the central web 7. A connection element 17 in each case runs above and below the central web 7, parallel thereto, and in each case leads from one collector contact plate 19 to another collector contact plate 19 of a partial area according to FIG. 3. These collector contact plates 19 each guide the entire current of one of the shown 12 partial areas of the sensor carrier pane and are therefore designed accordingly in terms of their load-bearing capacity. The connection elements 17 indicated in their entirety in FIG. 4 ensure the electrical series connection of all 12 partial areas.

A cross section transverse to the central web 7 is illustrated along the line of section A-A in the lower image half of FIG. 5 at a point where the crossmember illustrated in the identifying circle can be seen. Here, besides the sensor carrier pane 13 and the central web 7, circular openings are also shown in the crossmember 18 to the left and to the right of the central web 7, a connection element 17 being guided through each opening.

In the cross section B-B shown therebelow, a connection element 17 with its bridge-shaped profile can be seen accordingly in cross section, rotated through 90 degrees.

FIG. 6 shows a cross section through the used laser contacting arrangement. This laser contacting arrangement ensures a contactless, quick and reliable contacting as an electrical connection between two electrical conductors. The use of a laser in this region ensures that the two conductors to be connected are not contacted by the connection tool, are only heated for a very short period of time, and therefore practically do not deform and therefore can be processed by means of automatic adjustment means. The laser contacting arrangement is guided and controlled by means of a receiving shaft 22 for a portal carrier head. In the shown example, a connection element is electrically conductively connected in each case to a collector contact plate 19 by means of a gripper 20 and the laser 21.

To hold the contact elements or contact partners to be connected by the laser contacting arrangement, corresponding holding means are provided, which are oriented in a laser controlled manner toward the specific markings of the concentrator module. The use of these holding means is not illustrated separately.

Once all necessary electrical connections have been contacted and a lens pane 16 has been applied, the concentrator modules manufactured thus far are fed to an arrangement for testing electrical properties, wherein a certain voltage is applied to CPV sensors (11) themselves and the light emitted therefrom via the lenses (15) is detected and evaluated. If manufacturing faults are discovered in this region, these can be corrected manually or automatically.

Following the final manufacture of a concentrator module, the concentrator modules are fed to an arrangement for tightness testing (5), wherein compressed air is applied to the interior of these modules and testing for the emission of compressed air is performed.

The control of the complex movement processes and the signal processing of the used sensors require a special control.

LIST OF REFERENCE SIGNS

1 laser head
2 laser portal
3 contacting space
4 stacking spaces
5 test space (tightness test)
6 test space (electrics)
7 central web of a concentrator module
8 collector line (negative pole)
9 collector line (positive pole)
10 cooling and contact plate
11 CPV sensor (absorber)
12 contact point on the plate 10
13 sensor carrier pane of a concentrator module
14 contact point of a CPV sensor (absorber)
15 lens
16 lens pane
17 connection element (flat ribbon or cable)
18 crossmember
19 collector contact plate
20 gripper
21 laser
22 magazine for lens panes
23 receiving shaft for portal carrier head

The invention claimed is:

1. A method for the industrial wiring of photovoltaic concentrator modules comprising a module frame, a lens pane, a sensor carrier pane, and an electric line guide, comprising the following features:

g) applying connection elements (17) and collector contact plates (19) to individual concentrating photovoltaic sensors to the sensor carrier pane (13), h) positioning the required positive and negative connection lines, connection elements (17) and collector contact plates (19) by a gripper (20), and electrically conductively connecting a first set of individual concentrating photovoltaic sensors (11) to each other and positive connection lines and a second set of individual concentrating photovoltaic sensors (11) to each other and negative connection lines via a laser contacting arrangement, i) the collector contact plates (19) of the contacted sub-circuits are electrically connected and resultant positive and negative collector lines (8, 9) are fed to an external connection element, wherein the concentrator module is then provided with a lens pane (16) over the individual concentrating photovoltaic sensors (11), wherein the first set of individual concentrating photovoltaic sensors (11) are electrically conductively connected to each other and the positive connection lines in series and the second set of individual concentrating photovoltaic sensors (11) are electrically conductively connected to each other and the negative connection lines in series.

2. The method as claimed in claim 1, wherein the contact partners, before the connection by the laser contacting arrangement, are fixed in their target position by the gripper, and wherein the laser contacting arrangement ensures that the two conductors to be connected are not contacted by the laser and therefore practically do not deform.

3. The method as claimed in claim 1, wherein the positioning of the gripper (20) is oriented toward markings on the concentrator module.

4. The method as claimed in claim 1, wherein each line guide on the sensor carrier pane (13) comprises five CPV sensors connected in parallel.

* * * * *